United States Patent
Park et al.

(10) Patent No.: US 7,828,618 B2
(45) Date of Patent: Nov. 9, 2010

(54) SUPER-THIN OLED AND METHOD FOR MANUFACTURING THE SAME

(75) Inventors: Jin-Woo Park, Yongin-si (KR);
Jang-Hyuk Kwon, Suwon-si (KR);
Ho-Kyoon Chung, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 378 days.

(21) Appl. No.: 11/745,815

(22) Filed: May 8, 2007

(65) Prior Publication Data
US 2007/0207696 A1    Sep. 6, 2007

Related U.S. Application Data

(62) Division of application No. 10/976,807, filed on Nov. 1, 2004, now abandoned.

(30) Foreign Application Priority Data

Nov. 14, 2003    (KR) ............................ 2003-80539

(51) Int. Cl.
*H01J 1/62*    (2006.01)
*H01J 63/04*    (2006.01)
*H01J 9/24*    (2006.01)
*H01J 9/26*    (2006.01)

(52) U.S. Cl. ................. 445/25; 313/483; 313/503; 313/504; 313/505; 313/506; 313/512; 445/1; 445/23; 445/24

(58) Field of Classification Search .................. None
See application file for complete search history.

(56) References Cited

U.S. PATENT DOCUMENTS 5,681,666 A    10/1997    Treger et al.

(Continued)

FOREIGN PATENT DOCUMENTS

EP    1411562    4/2004

(Continued)

OTHER PUBLICATIONS

Chinese Office Action mailed Jul. 4, 2008.
European Search Report dated Jul. 2, 2007.

*Primary Examiner*—Nimeshkumar D Patel
*Assistant Examiner*—Natalie K Walford
(74) *Attorney, Agent, or Firm*—H.C. Park & Associates, PLC

(57) ABSTRACT

A flat panel display includes a glass substrate, an organic light-emitting part, and a sealing part. The organic light-emitting part includes one or more organic light-emitting devices (OLED) formed on a surface of the glass substrate, which has a thickness of about 0.05 mm to about 0.5 mm. The sealing part seals the organic light-emitting part and protects it from damage during the manufacturing process. A method for manufacturing the flat panel display includes preparing a glass substrate of approximately 0.7 mm thickness or greater; forming a plurality of organic light-emitting devices on a surface of the glass substrate, wherein a group of one or more of the plurality of organic light-emitting devices constitutes an organic light-emitting part; sealing each organic light-emitting part; and etching the glass substrate to a predetermined thickness.

17 Claims, 6 Drawing Sheets

U.S. PATENT DOCUMENTS

| | | | |
|---|---|---|---|
| 5,757,126 | A | 5/1998 | Harvey et al. |
| 6,137,221 | A | 10/2000 | Roitman et al. |
| 6,611,097 | B1 | 8/2003 | Hanahara et al. |
| 6,617,052 | B2 | 9/2003 | Morii |
| 6,646,711 | B2 | 11/2003 | Sugano |
| 6,896,572 | B2 * | 5/2005 | Park et al. .................. 445/25 |
| 6,930,748 | B2 * | 8/2005 | Moon ........................ 349/158 |
| 6,998,772 | B2 | 2/2006 | Terumoto |
| 7,112,115 | B1 * | 9/2006 | Yamazaki et al. ............ 445/25 |
| 2002/0003403 | A1 * | 1/2002 | Ghosh et al. ................ 313/512 |
| 2002/0068143 | A1 | 6/2002 | Silvernail et al. |
| 2002/0079831 | A1 | 6/2002 | He et al. |
| 2003/0048404 | A1 | 3/2003 | Sohn et al. |
| 2003/0064540 | A1 | 4/2003 | Auch et al. |
| 2003/0168976 | A1 * | 9/2003 | Nishimura et al. .......... 313/512 |
| 2006/0121363 | A1 * | 6/2006 | Kwon ........................... 430/5 |

FOREIGN PATENT DOCUMENTS

| | | |
|---|---|---|
| JP | 2001-282146 | 10/2001 |
| JP | 2002318545 | 10/2002 |
| JP | 2002318547 | 10/2002 |
| JP | 2003059643 | 2/2003 |
| JP | 2003066858 | 3/2003 |
| JP | 2003-216068 | 9/2003 |
| JP | 2003-317937 | 11/2003 |
| JP | 2004-103526 | 4/2004 |
| JP | 2005078932 | 3/2005 |
| WO | 01-04963 | 1/2001 |

* cited by examiner

SUPER-THIN OLED AND METHOD FOR MANUFACTURING THE SAME

CROSS-REFERENCE TO RELATED APPLICATION

This application is a divisional of prior application Ser. No. 10/976,807, filed Nov. 1, 2004, which claims priority to and the benefit of Korean Patent Application No. 2003-80539, filed on Nov. 14, 2003 which are all hereby incorporated by reference for all purposes as if fully set forth herein.

BACKGROUND OF THE INVENTION

1. Field of the Invention

The present invention relates to a super-thin, organic, light-emitting display (OLED) having a super thin glass substrate and a method for manufacturing the same.

2. Description of the Related Art

Planarized display devices, such as an OLED or a thin film transistor liquid crystal display (TFT-LCD), can be formed in super thin and flexible structures. A super thin and flexible planarized display device may be produced using a flexible substrate, typically formed of a synthesized resin. However, the thickness of the substrate is maintained in a conventional thickness range because there is significant risk that the synthesized substrate, or thin film layers formed on it, will be deformed during the complicated manufacturing processes.

Conventional flexible planarized display devices typically bind a highly flexible substrate to a transparent substrate using organic thin films. One thin film is formed on one substrate, another on the other substrate. The two films are then aligned, placed in contact with each other, and sealed to bond the films together. A significant disadvantage associated with producing OLEDs in this manner is that aligning the organic thin films is difficult, not only because the thin films are manufactured separately, but also because it is nearly impossible to tightly adhere thin films that have the same or a similar predetermined pattern.

Various conventional solutions have been proposed, but in each the thickness of the substrate is maintained in a conventional range, which typically exceeds 0.5 mm, because the substrate must have a predetermined strength and temperature resistance to withstand the complicated processes used to form thin film layers (at least one or more of which may be an organic film) on the substrate. Glass materials have been used to form conventional OLED substrates, but the thickness of these substrates could not be reduced to less than 0.5 mm, due to the fabrication constraints described above.

SUMMARY OF THE INVENTION

The present invention provides a flat panel display that includes a glass substrate, an organic light-emitting part, and a sealing part. The organic light-emitting part includes one or more organic light-emitting devices (OLED) formed on a surface of the glass substrate, which has a thickness of about 0.05 mm to about 0.5 mm. The sealing part seals the organic light-emitting part and protects it from damage during the manufacturing process. A method for manufacturing the flat panel display comprises preparing a glass substrate of approximately 0.7 mm thickness or greater; forming a plurality of organic light-emitting devices on a surface of the substrate, wherein the organic light-emitting part comprises a grouping of one or more of the plurality of organic light-emitting devices; sealing each organic light-emitting part; and etching the glass substrate to a predetermined thickness.

In another embodiment, the OLED includes a glass substrate of approximately 0.05 mm to approximately 0.5 mm thickness, an organic light emission layer in contact with a surface of the glass substrate, and a sealing part to seal the organic light emission layer. A first electrode is formed on one side of the organic light emission layer, and a second electrode is formed on a second side of the organic light emission layer. The sealing part is a stacked film which includes at least a barrier layer and a polymer layer. The flat panel display may further include a circular polarized film attached to an outer surface of the sealing part.

An embodiment of a flat panel display having front and back viewing areas on which the same or different pictures can be displayed substantially simultaneously, together with various methods of manufacture, are also disclosed.

DETAILED DESCRIPTION OF THE INVENTION

Figure 1:
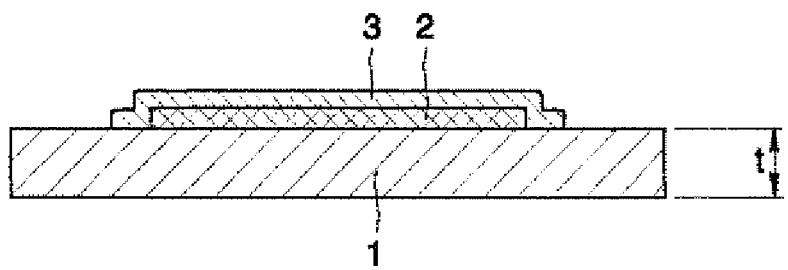
FIG. 1 is a cross-sectional view of an OLED configured in accordance with an embodiment of the present invention.

FIG. 1 is a cross-sectional view of an OLED configured in accordance with an embodiment of the present invention.

Referring to FIG. 1, the organic light-emitting device (OLED) includes a transparent glass substrate 1, an organic light-emitting part 2, and a sealing part 3 that seals the organic light-emitting part 2.

Figure 2:
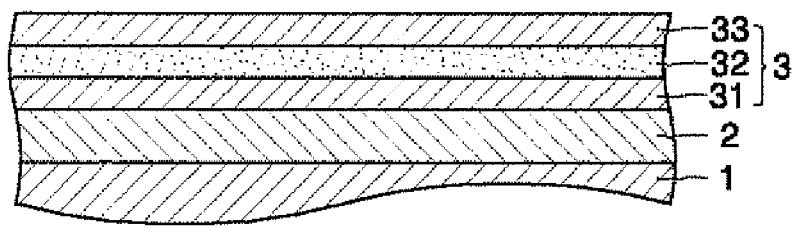
FIG. 2 is a cross-sectional view of a sealing part shown in FIG. 1.

In one embodiment of the present invention, the sealing part 3 can include at least a barrier layer and at least a polymer layer. However, as seen in FIG. 2, the sealing part 3 can also include a polymer layer 32 inserted between barrier layers 31 and 33.

The barrier layers 31 and 33 that constitute a sealing part 3 can be formed of a transparent blocking material, but are not necessarily limited thereto. The barrier layer can be formed of a material selected from a metal oxide, a metal nitride, a metal carbide, a metal oxynitride, and a compound of these materials. The metal oxide can be an oxide selected from silica, alumina, titania, indium oxide, tin oxide, indium tin oxide, and a compound of these materials. The metal nitride can be an aluminum nitride, a silicon nitride, and a compound of these materials. The metal carbide can be a silicon carbide, and the metal oxynitride can be a silicon oxynitride. Other inorganic materials, such as silicon, that block penetration of moisture or oxygen can also be used as material for the barrier layer.

These barrier layers can be formed using a chemical or vacuum deposition method. However, when a barrier layer is formed using a vacuum deposition method, pores in the barrier layer can grow. To prevent pores from growing, a polymer layer may be formed on the barrier layer. The polymer layer may be formed of a polymer selected from an organic polymer, an inorganic polymer, an organometallic polymer, and a hybrid organic/inorganic polymer.

It is understood that the sealing part 3 can be formed in a variety of forms other than the structure described above, including a super thin sealing part 3 formed in thin films. Other thin films that from a sealing part in a super thin structure may also include a polymer layer and a barrier layer, as described above.

The organic light-emitting part 2 includes an organic light-emitting device, and can be a region for defining a predetermined image. In an exemplary embodiment, the organic light-emitting device is a pixel. The organic light-emitting device can be either a passive matrix organic light-emitting device (PMOLED) or an active matrix organic light-emitting device (AMOLED) having a thin film transistor.

Figure 3:
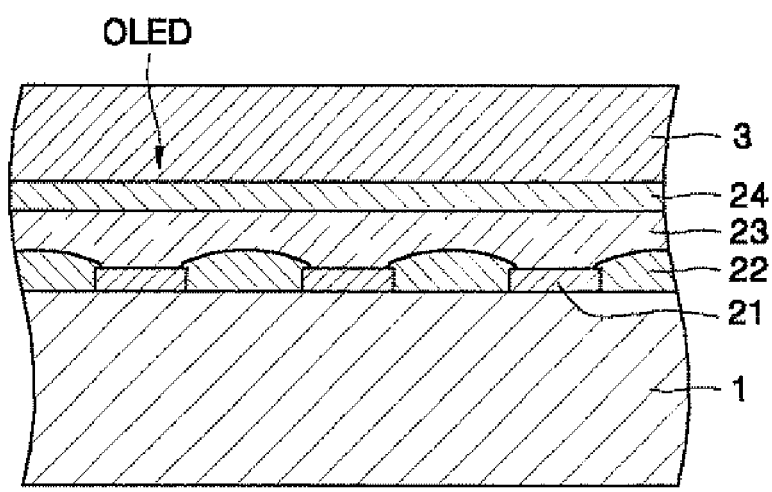
FIG. 3 is a cross-sectional view of an example of an OLED light-emitting part shown in FIG. 1.

FIG. 3 shows an example of a PMOLED. The PMOLED includes a glass substrate 1, a stripe-patterned first electrode layer 21 formed on the glass substrate 1, as well as an organic layer 23 and a second electrode layer 24 sequentially formed on the first electrode layer 21. In another embodiment, an insulating layer 22 can further be formed between each pattern line of the first electrode layer 21. Similarly, the second electrode layer 24 can be formed in a pattern substantially orthogonal to the pattern of the first electrode layer 22. The organic layer 23 can be formed of a polymer or non-polymer organic layer.

When using a non-polymer organic layer, the organic layer 23 can be single-layered or multi-layered. An exemplary multi-layered organic layer 23 includes a Hole Injection Layer (HIL), a Hole Transport Layer (HTL), an Emission Layer (EML), an Electron Transport Layer (ETL), and an Electron Injection Layer (EIL). Organic materials that may be used are copper phthalocyanine (CuPc), N,N'-Di(naphthalene-1-yl)-N,N'-diphenyl-benzidine (NPB), or tris-8-hydroxyquinoline aluminum (Alq3), but are not limited thereto. The non-polymer organic layer can also be formed using a vacuum deposition method.

When using a polymeric organic layer, the organic layer 23 can be formed of a HTL and an EML. In this case, the HTL can be formed of PEDOT (poly(3,4-ethylenedioxythiophene), and the EML can be formed of a Poly-Phenylenevinylene (PPV) and Polyfluorene. A screen printing method or an ink jet printing method can be used for forming these layers.

In one embodiment, the first electrode layer 21 performs as an anode, and the second electrode layer 24 performs as a cathode. Naturally, the function of these electrodes can be reversed.

In one embodiment, the organic light-emitting device is a rearward light-emitting device. In such a case, the first electrode layer 21 is an electrode formed of a transparent conductive material such as, but not limited to, indium tin oxide (ITO). When the organic light-emitting device is a frontal light-emitting device, the second electrode layer 24 is formed by depositing ITO, or similar transparent conductive material, on a semi-transparent thin film made of Magnesium-Silver (Mg—Ag) or similar metal or metal alloy.

Figure 4:
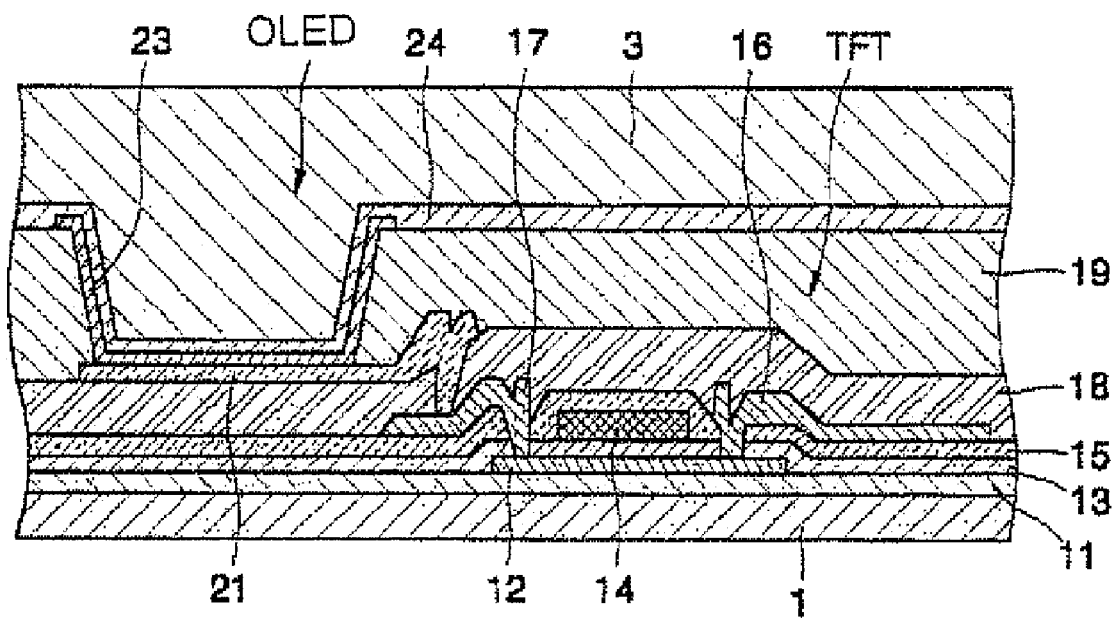
FIG. 4 is a cross-sectional view of another example of the OLED light-emitting part in FIG. 1.

FIG. 4 shows an example of an AMOLED. At this point, it should be noted that the pixels of the organic light-emitting part 2 of FIG. 1, have the same thin film transistor (TFT) structure and electrode (EL) device (OLED), as depicted in FIG. 4. The TFT configuration of FIG. 4, however, is not necessarily limited to that shown, but may vary depending on the embodiment.

Referring again to FIG. 4, a buffer layer 11 formed of $SiO_2$ is formed on a glass substrate 1, and a TFT is formed on the buffer layer 11.

The TFT has an active layer 12 formed on the buffer layer 11, a gate insulating film 13 formed on the active layer 12, and a gate electrode 14 formed on the gate insulating film 13.

The active layer 12 can be formed of an amorphous silicon thin film or polycrystalline silicon thin film. The active layer 12 has a source region and a drain region heavily doped with an n-type or a p-type dopant, respectively.

A gate insulating film 13 is formed on the active layer 12, and a gate electrode 14 formed of a conductive film made of MoW or aluminum/copper (Al/Cu) is formed on a predetermined region on the gate insulating film 13. The gate electrode 14 is connected to a gate line that applies an on/off signal to the TFT. The region for forming the gate electrode 14 corresponds to a region for forming a channel region of the active layer 12.

An interinsulating layer 15 is formed on the gate electrode 12, and a source electrode 16 and a drain electrode 17 are respectively connected through contact holes to the source region and the drain region formed on the active layer 12.

A passivation film 18 formed of $SiO_2$ covers the source electrode 16 and the drain electrode 17, and a planarized film 19 formed of acryl or polyimide is formed on the passivation film 18. The planarized film 19 covers a portion of a lower electrode 21. As shown, the planarized film 19 includes an opening therein, which serves as a via. A lower electrode 21 forms the bottom of the opening. An organic emission layer 23 is formed within the opening in contact with surfaces of the planarized film 19 which form sides of the opening, and in contact with an upper surface of the lower electrode 21. An upper electrode 24 is formed on a surface of the planarization film 19 and the organic emission layer 23. The TFT is connected to at least a capacitor (not shown) and to a power source. The drain electrode 17 is connected to the first electrode layer (lower electrode) 21 which, in this embodiment, is an anode of the OLED.

In use, variable current passing between the lower electrode 21 and the upper electrode 24 energizes the organic emission layer 23, causing it to emit various wavelengths (and colors) of light in approximate proportion to the amount of current received. In one embodiment, the organic emission layer 23 can emit one of a red (R), green (G), or blue (B) color to display predetermined image information.

As shown in FIG. 4, the first electrode layer (lower electrode) 21 is connected to the drain electrode 17 of the TFT and receives a positive power source therefrom. The second electrode layer (upper electrode) 24 covers whole pixels and supplies a negative power source. The organic layer 23, which emits light in response to current supplied thereto, is disposed between the first electrode 21 and second electrode 24.

The first electrode layer 21 can be formed of a transparent conductive material such as, but not limited to indium tin oxide (ITO). If the OLED is a rear light-emitting device, the second electrode layer 24 can be formed such that it emits light toward the glass substrate 1. In such an embodiment, the second electrode layer 24 can be formed by depositing Al/LiF on the entire surface.

If the OLED is a front light-emitting device, the layer 24 can be formed by depositing indium tin oxide (ITO) on a semi-transparent thin film formed of Magnesium-Silver (Mg—Ag). The second electrode layer 24 need not necessarily be formed by depositing its formation material on the entire surface of the substrate or a layer thereof, but rather can be formed in variety of patterns. As mentioned previously, the first electrode layer 21 and the second electrode layer 24 can be configured to have reverse positions and functions.

As shown in FIG. 1, an OLED configured in accordance with an embodiment of the present invention has a thickness of approximately 0.05 mm to approximately 0.5 mm. Because a glass substrate 1 of this approximate thickness is super-thin, there is a risk that deformation of the substrate 1 will occur if the conventional manufacturing processes described above are used. To prevent or reduce deformation, an embodiment of the present invention uses an etching process to form a glass substrate 1 to a super-thin thickness of approximately 0.05 mm to approximately 0.5 mm.

Hereinafter, a method for manufacturing the OLED according to one embodiment of the present invention will be described.

Figure 5A:
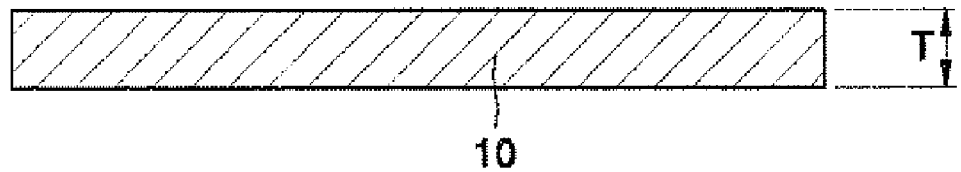
FIGS. 5A, 5B, 5C, 5D, 5E and 5F are cross-sectional views illustrating a method of manufacturing the OLED of FIG. 1.

Referring to FIG. 5A, a transparent glass substrate 10 is prepared. The thickness T of the transparent glass substrate 10 is sufficiently thick so that the transparent glass substrate 10 has sufficient structural strength to prevent pattern or reduce deformation of the organic light-emitting part during image formation and to prevent or reduce damages or defects during the manufacturing process. In one embodiment of the present information, the thickness T of the transparent glass substrate 10 can be more than 0.7 mm.

Figure 5B:
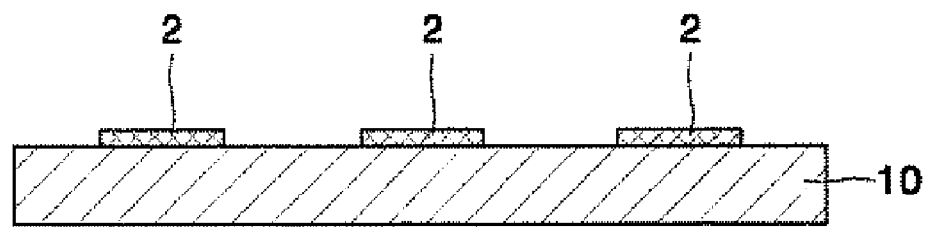

Referring to FIG. 5B, a plurality of organic light-emitting parts 2 are formed on the transparent glass substrate 10. The organic light-emitting parts 2 are identical in configuration and function as the organic light-emitting parts 2 described with reference to FIGS. 1, 2, 3 and 4.

Figure 5C:
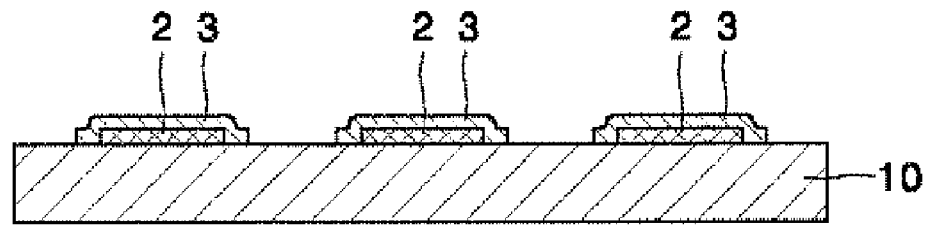

Referring to FIG. 5C, the organic light-emitting parts 2 are sealed by sealing parts 3. The sealing parts 3 can be formed in the thin films as described above.

Figure 5D:
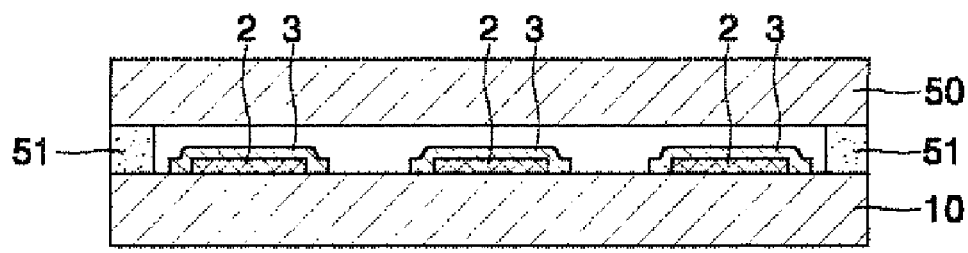

After forming the sealing parts 3, the plurality of organic light-emitting parts 2 are sealed by a sealing glass 50 (FIG. 5D). Then a sealing material 51 is applied on edges of the organic light-emitting part region, and the sealing glass 50 is bonded to the sealing material 51. In this manner, the transparent glass substrate 10 and the sealing glass 50 are bonded and sealed on the edge regions by the sealing material 51.

Figure 5E:
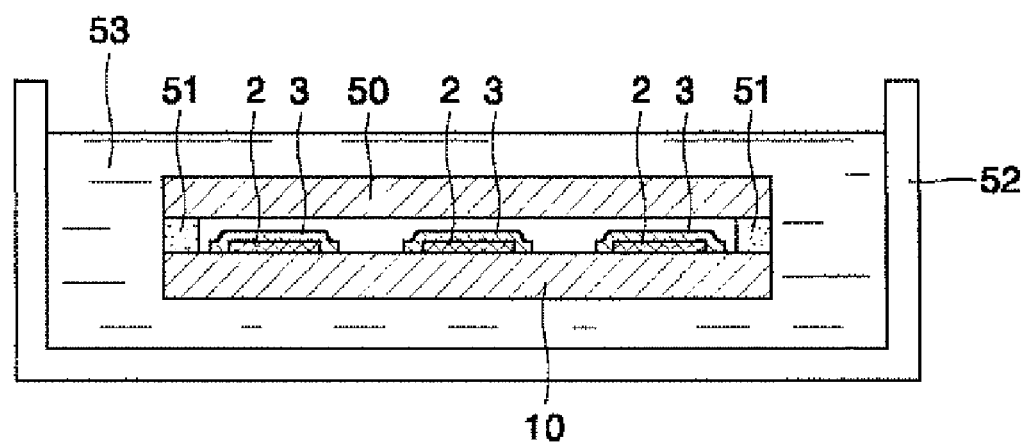

Referring to FIG. 5E, after sealing the transparent glass substrate 10, the product is immersed in a basin 52 which contains a predetermined etching solution 53. The etching solution can be fluoric acid, hydrochloric acid, or similar etching material. Over time, the etching solution reduces the thickness T of the transparent glass substrate 10 to a value of approximately 0.05 mm to approximately 0.5 mm.

Figure 5F:
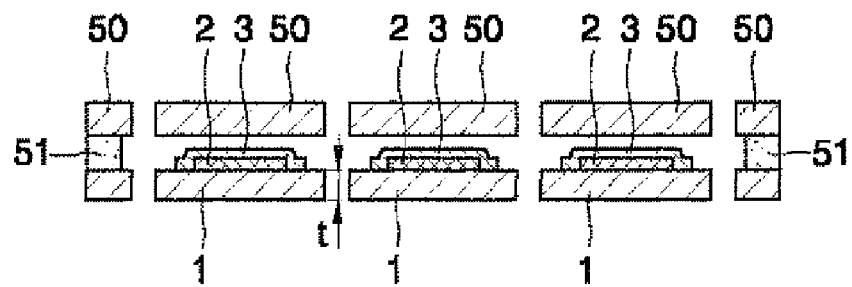

Referring to FIG. 5F, upon completing the etching of the transparent glass substrate 10, the sealing glass 50 and the glass substrate 10 are simultaneously, or nearly simultaneously, cut at predetermined cutting points, which may vary, depending on how the organic light-emitting parts 2 were first positioned. Once the sealed edges are cut away, the sealing glass easily separates from each organic light-emitting part 2. Thereafter, the sealed edges and pieces of cut sealing glass can be discarded or recycled. In this manner, the organic light-emitting parts can be readily obtained without using an additional separation process because the sealing glass 50 is not bonded to each organic light-emitting part 2, but only to the edges of each region. The result of this manufacturing process is that one or more organic light-emitting devices 2 are produced, each having a super-thin glass substrate 1 which has a thickness of approximately 0.05 mm to approximately 0.5 mm. In FIG. 5F, each piece represents the OLED shown in FIG. 1.

Figure 6:
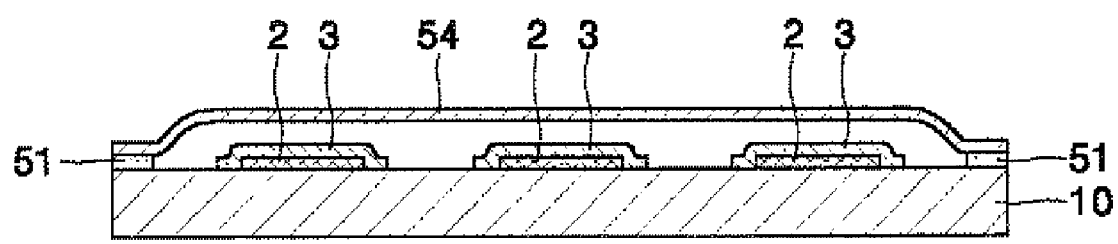
FIGS. 6 and 7 are cross-sectional views illustrating different embodiments of the manufacturing steps described with reference to FIG. 5D.

Referring to FIG. 6, a sealing film 54 can be used instead of the sealing glass 50. In this case, the same result as above is obtained. The sealing film 54 is formed of a material or materials that are insoluble and impermeable to the etching solution 53.

Figure 7:
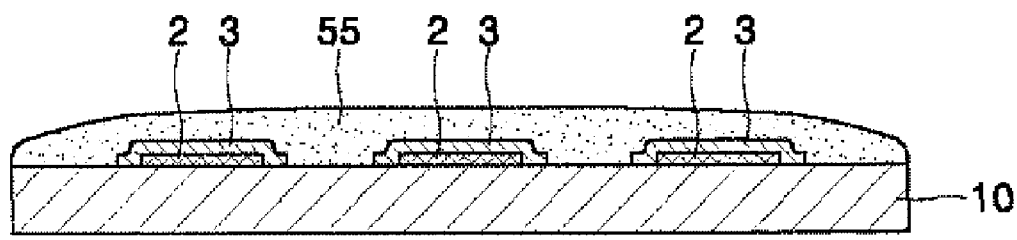

Referring to FIG. 7, the transparent glass 10 can be sealed with a resin material 55. In this case, an additional process for removing the sealing resin material 55 after etching is required.

Figure 8:
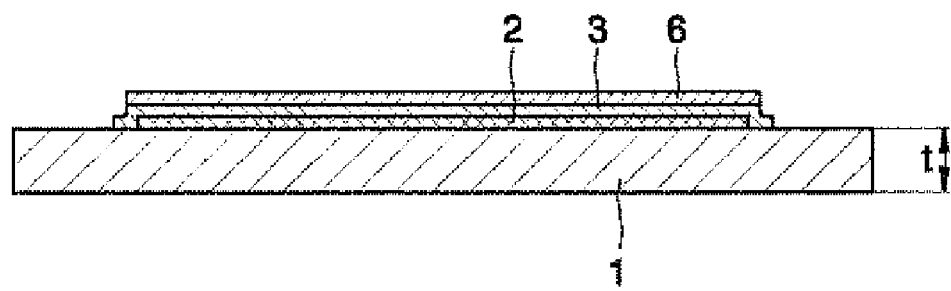
FIG. 8 is a cross-sectional view of an OLED configured in accordance with an embodiment of the present invention.

FIG. 8 is a cross-sectional view of an OLED configured in accordance with another exemplary embodiment of the present invention. In this embodiment, the basic structure of the OLED of FIG. 8 is the same structure of the OLED described with reference to FIGS. 1, 2, 3 and 4.

The exemplary methods of manufacture described above can be applied to a frontal light emission OLED, that is, an OLED where the light is emitted toward the sealing part 3. To strengthen a sealing part 3, a circular polarized film 6 can be attached on an outer surface of the sealing part 3 to not only block external light from reaching the organic light-emitting devices, but also to give the sealing part 3 an increased predetermined strength. Alternatively, the strength of the sealing part 3 can be increased by attaching a glass substrate or film having a thickness of approximately 0.05 mm to approximately 0.3 mm to the sealing part 3.

Figure 9:
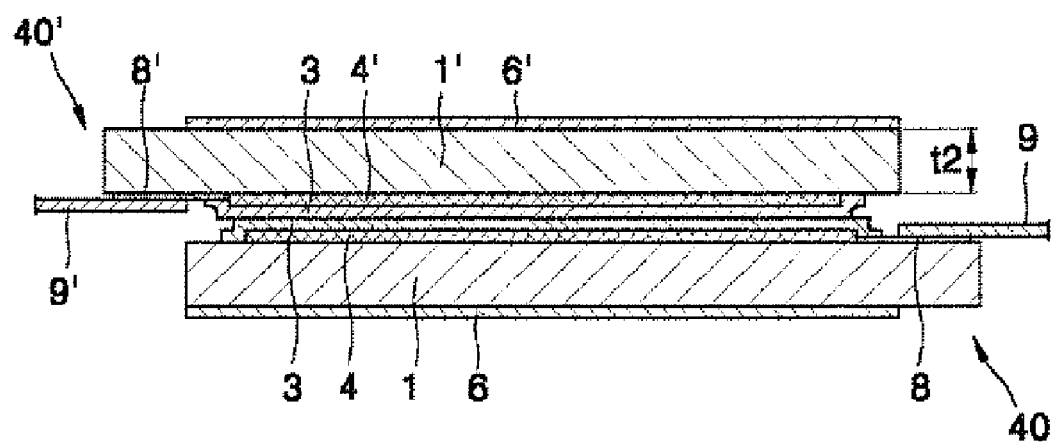
FIG. 9 is a cross-sectional view of an OLED configured in accordance with yet another embodiment of the present invention.

In FIG. 9, an OLED configured in accordance with another exemplary embodiment of the present invention is depicted. This is a double-sided OLED formed by combining two OLEDs configured as described above.

The OLED depicted in FIG. 9 includes a first OLED 40 and a second OLED 40'. The first OLED 40 includes a display region 4 and a terminal region 8 having an organic light-emitting device formed on the glass substrate 1. The display region 4 is sealed by a sealing part 3. In this example, the display region 4 can be considered as a corresponding part to the organic light-emitting part 2 in FIG. 1, but is not limited thereto. The sealing part in this figure is identical to the sealing part 3 previously mentioned.

The terminal region 8 is not sealed by the sealing part 3 but is exposed to the outside. As seen in FIG. 9, connecting parts 9 such as chip on glass (COG) or flexible printed circuit (FPC) for connecting the external electronic devices are connected to the terminal region 8. The second OLED 40' has the same structure as the first OLED 40, therefore, a detailed description thereof will be omitted.

The sealing parts 3 and 3' of the first and the second OLEDs 40 and 40', which seal the display regions 4 and 4', respectively, are bonded contacting each other so that the glass substrates 1 and 1' face outward. The terminal regions 8 and 8' are bonded to face in opposite directions. This bonding configuration of the terminal regions 8 and 8' permits the later connection of external devices to the connecting parts 9 and 9'. In this manner, a super-thin, double-sided OLED can be constructed.

When manufacturing the double sided OLED, the circular polarized films 6 and 6', described above with reference to FIG. 8, can be applied on each external surface of the substrates 1 and 1' (or sealing parts 3 and 3') to block external light and increase the strength of the substrate 1 and 1' (or sealing parts 3 and 3').

As shown, described, and claimed herein, embodiments of the present invention permit a super-thin OLED to be manufactured to have a super-thin glass substrate that is not damaged during the manufacturing process. Moreover, adding a circularly polarized film to an outer surface of a sealing part increases the strength of a super thin OLED and blocks light from reaching and interfering with the organic light-emitting devices.

While this invention has been particularly shown and described with reference to preferred embodiments thereof, it will be understood by those skilled in the art that various changes in form and details may be made therein without departing from the spirit and scope of the present invention as defined by the appended claims.

What is claimed is:

1. A method for manufacturing a flat panel display, comprising:
   forming a plurality of organic light-emitting parts on a surface of a glass substrate, wherein each organic light-emitting part comprises a grouping of one or more of a plurality of organic light-emitting devices;
   sealing each organic light-emitting part;
   bonding a sealing glass substrate to the glass substrate by a sealing material, wherein the sealing material surrounds all of the organic light-emitting parts and forms a single closed loop around all of the organic light-emitting parts;
   etching the glass substrate; and
   cutting the glass substrate and the sealing glass substrate at cut points, wherein the cut points are between the organic light-emitting parts and the sealing material, and the sealing glass is thereby removed from each organic light-emitting part.

2. The method of claim 1, wherein sealing each organic light-emitting part further comprises:
   sealing each organic light-emitting part using a sealing film.

3. The method of claim 1, wherein sealing each organic light-emitting part further comprises:
   sealing each organic light-emitting part using a resin material.

4. The method of claim 3, further comprising:
   removing the resin material after etching the glass substrate.

5. The method of claim 1, wherein sealing each organic light-emitting part further comprises:
   depositing about each organic light-emitting part, a barrier layer to seal each organic light-emitting part; and
   forming at least a polymer layer on the barrier layer.

6. The method of claim 5, wherein the barrier layer is formed of at least one of a material selected from the group consisting of silicon, metal oxide, metal nitride, metal carbide, metal oxynitride, and a compound of these materials.

7. The method of claim 5, wherein the polymer layer is formed of at least one of a material selected from the group consisting of an organic polymer, an inorganic polymer, an organometallic polymer, and a hybrid organic/inorganic polymer.

8. The method of claim 1, wherein the glass substrate is etched to a thickness of about 0.05 mm to about 0.5 mm.

9. A method for manufacturing a flat panel display, comprising:
   forming a plurality of organic light-emitting parts on a surface of a glass substrate, wherein each organic light-emitting part comprises a grouping of one or more of a plurality of organic light-emitting devices;
   sealing each organic light-emitting part using a resin material;
   bonding a sealing glass substrate to the glass substrate by a sealing material, wherein the sealing material surrounds the organic light-emitting parts;
   etching the glass substrate;
   cutting the glass substrate and the sealing glass substrate at cut points, wherein the cut points are between the organic light-emitting parts; and
   removing the resin material after etching the glass substrate.

10. A method for manufacturing a flat panel display, comprising:
    forming a plurality of organic light-emitting parts on a surface of a glass substrate, wherein each organic light-emitting part comprises a grouping of one or more of a plurality of organic light-emitting devices;
    sealing each organic light-emitting part;
    bonding a first sealing film substrate to the glass substrate by a sealing material, wherein the sealing material surrounds all of the organic light-emitting parts and forms a single closed loop around all of the organic light-emitting parts;
    etching the glass substrate; and
    cutting the glass substrate and the first sealing film substrate at cut points, wherein the cut points are between the organic light-emitting parts and the sealing material thereby the first sealing film is removed from each organic light-emitting part.

11. The method of claim 10, wherein sealing each organic light-emitting part further comprises:
    sealing each organic light-emitting part using a second sealing film.

12. The method of claim 10, wherein sealing each organic light-emitting part further comprises:
    sealing each organic light-emitting part using a resin material.

13. The method of claim 12, further comprising:
    removing the resin material after etching the glass substrate.

14. The method of claim 10, wherein sealing each organic light-emitting part further comprises:
    depositing about each organic light-emitting part, a barrier layer to seal each organic light-emitting part; and
    forming at least a polymer layer on the barrier layer.

15. The method of claim 14, wherein the barrier layer is formed of at least one of a material selected from the group consisting of silicon, metal oxide, metal nitride, metal carbide, metal oxynitride, and a compound of these materials.

16. The method of claim 14, wherein the polymer layer is formed of at least a material selected from the group consisting of an organic polymer, an inorganic polymer, an organometallic polymer, and a hybrid organic/inorganic polymer.

17. The method of claim 10, wherein the glass substrate is etched to a thickness of about 0.05 mm to about 0.5 mm.

* * * * *